United States Patent [19]

Cuneo

[11] 3,981,691

[45] Sept. 21, 1976

[54] METAL-CLAD DIELECTRIC SHEETING HAVING AN IMPROVED BOND BETWEEN THE METAL AND DIELECTRIC LAYERS

[75] Inventor: Edward A. Cuneo, Shoreview, Minn.

[73] Assignee: Minnesota Mining and Manufacturing Company, St. Paul, Minn.

[22] Filed: July 1, 1974

[21] Appl. No.: 484,952

[52] U.S. Cl. .................................... 29/195; 29/199; 156/3; 156/309; 174/68.5; 317/101 B; 428/414; 428/418; 428/458; 428/472; 428/901

[51] Int. Cl.² ................... B32B 15/08; B32B 15/20; C23F 1/02; H05K 1/00

[58] Field of Search ........... 336/200, 205, 206, 208; 317/101 B, 101 C; 174/68.5; 161/225; 148/6.2; 156/309, 3, 18; 428/458, 472, 901, 414, 418; 29/191, 195 P, 196.6, 199; 204/28

[56] References Cited
UNITED STATES PATENTS

| | | | |
|---|---|---|---|
| 2,824,829 | 2/1958 | Quaely | 204/43 R |
| 2,932,599 | 4/1960 | Dahlgren | 161/225 |
| 3,240,662 | 3/1966 | Smyers | 161/225 |
| 3,245,577 | 4/1966 | Virzi | 29/195 P |
| 3,483,058 | 12/1969 | Benz | 161/225 |
| 3,526,486 | 9/1970 | Smith | 29/196.6 |
| 3,586,568 | 6/1971 | Campbell | 161/225 |
| 3,671,205 | 6/1972 | Uchida et al. | 29/195 P |
| 3,677,828 | 7/1972 | Caull | 161/225 |
| 3,679,513 | 5/1970 | Addinall et al. | 161/225 |
| 3,781,596 | 12/1973 | Galli et al. | 174/68.5 |
| 3,799,814 | 3/1974 | Yamagishi et al. | 29/196.6 |
| 3,826,675 | 7/1974 | Smith et al. | 29/195 P |
| 3,853,716 | 12/1974 | Yates et al. | 204/28 |
| 3,857,683 | 12/1974 | Castonguay | 29/195 P |

OTHER PUBLICATIONS

Holland, Adhesives Age, pp. 17–25, Apr., 1973.

Primary Examiner—J.C. Cannon
Attorney, Agent, or Firm—Alexander, Sell, Steldt & DeLaHunt

[57] ABSTRACT

An improved bond between the metal and dielectric layers of metal-clad dielectric sheeting is obtained by use of a black-chromium treatment on the metal layer.

13 Claims, 3 Drawing Figures

METAL-CLAD DIELECTRIC SHEETING HAVING AN IMPROVED BOND BETWEEN THE METAL AND DIELECTRIC LAYERS

INTRODUCTION

A lasting bond between the metal and dielectric layers of metal-clad dielectric sheeting is critical for manufacturing useful flexible electric circuitry from the sheeting, but it is difficult to obtain. In the course of first forming circuit portions from the metal-clad sheeting and then attaching other circuit portions and electrical components, the bond is subjected to a variety of chemical agents and physical manipulation. And the bond is especially susceptible to attack after the metal layer has been etched to leave only narrow-width (for example, 25 to 250 micrometers in width) electrical conductor segments.

Certain plating baths cause a particularly harsh attack on the bond between the metal and dielectric layers. For example, in the course of plating gold onto narrow-width copper conductors that are carried on a polyimide dielectric sheeting, there may be undercutting at the edges of the conductors and sometimes complete delamination of the conductors from the dielectric sheeting. While the exact mechanism for this attack is a mystery, it is theorized that certain components in the plating bath attack and etch away part of the metal layer at the interface between the metal and dielectric layers, whereupon the two layers are separated.

Various coatings or other treatments for copper foils, including several proprietary treatments, have been proposed to enhance adhesion between the copper foil and a dielectric layer. One proposal, described in Galli et al, U.S. Pat. No. 3,781,596, is that a layer of chromium or nickel be plated onto a copper layer to promote adhesion to a polyimide layer that is subsequently cast or laminated onto the copper layer. However, in my experience none of the prior suggestions, including the Galli et al suggestion, provides the needed degree of adhesion. For example, I have found that when copper-clad polyimide sheeting, in which the copper has been treated with chromium or nickel as suggested in Galli et al, is first etched to provide narrow-width conductors and then immersed in a gold-plating bath, the conductors become significantly undercut, often to the point of delamination, whereupon the product is no longer useful as flexible circuitry.

In summary, insofar as known, no one has provided a bond between the metal and dielectric layers of metal-clad dielectric sheeting necessary for the satisfactory use of that sheeting in manufacturing certain desired kinds of flexible electric circuitry.

SUMMARY OF THE INVENTION

By the present invention it has been found that while, as indicated above, a chromium treatment will not provide the needed bond at the interface between metal and dielectric layers, a "black-chromium" treatment will provide a lasting bond. A "black-chromium" layer or treatment, as used herein and in the plating industry, means an electrodeposited layer that is based on chromium but which contains a significant percentage of oxygen atoms (often accounting, for example, for 25 weight-percent of the layer, and probably being present as metal oxide molecules) such that the layer will have, in varying shades, a black appearance. Generally at least a majority of the metal atoms in the layer are chromium atoms. The black chromium treatment is firmly deposited onto the metal layer prior to coating or laminating the dielectric support layer onto the metal layer, by procedures that are well known in the art (see, for example, U.S. Pat. Nos. 1,975,239; 2,623,847; and 2,824,829; American Electroplaters Society, Proceedings of 40th Annual Convention, June 16, 1953, pp. 48–52; and Metal Finishing Guidebook and Directory, 1972, 40th annual edition, page 252).

In the past, black-chromium treatments have generally been used because of their black color, for example, for decorative purposes or to provide black-body properties on such articles as electron tube parts and bimetal heater elements. But I have found that a black-chromium layer also improves the bond between metal and dielectric layers, and generally prevents undercutting and delamination of the layers under conditions such as are encountered in a gold plating bath. The improvement in the bond can be indicated by exposing a sample of metal-clad dielectric sheeting, in which the metal layer has been given a black-chromium treatment and which has been etched to provide narrow-width conductors, to a 10-normal hydrochloric acid bath at 25°C. After 5 minutes of exposure, and preferably after even 30 minutes, there is generally no delamination of the conductors from the dielectric sheeting. If there is no delamination in this test, there will generally be no delamination in a gold plating bath.

A further advantage that is provided by a black-chromium treatment is an improvement in the physical bond strength between rolled copper foil and a dielectric layer. For example, when a laminate of rolled copper foil and polyimide dielectric sheeting is subjected to peel tests, higher test values are obtained when the rolled copper has been given a black-chromium treatment that when it has not been so treated. Rolled copper is desired for many embodiments of flexible circuitry, because it has a finer-grained structure (than electrodeposited copper, for example), it permits formation of leads having better resolution in an etching process, and it can be folded on itself. However, the lack of good physical bond strength between a dielectric layer and rolled copper has inhibited the use of rolled copper. The improvement provided by the present invention makes and important contribution to the usefulness of rolled copper.

DETAILED DESCRIPTION

Figure 1:
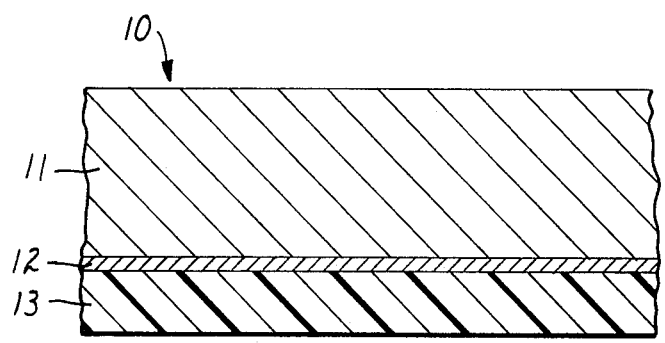
FIG. 1 is an enlarged cross-section through a metal-clad dielectric sheeting that has a black-chromium treatment between the metal and dielectric layers.

The invention will be further illustrated by the following examples.

EXAMPLE 1

A black-chromium plating bath (as described in Metal Finishing Guidebook and Directory, 1972, 40th annual edition, page 252) was prepared by adding the following ingredients to water:

|  | Ounces Per Gallon of Water | (Grams Per Liter of Water) |
| --- | --- | --- |
| Chromic acid | 35 | (262) |
| Acetic acid | 28.2 | (210) |
| Barium acetate | 1.0 | (7.5) |

With the bath heated to 100°F, (38°C), a 10-centimeter by 20-centimeter wire-mesh platinum-plated titanium electrode and a sample of one-ounce (about 1.4 mils or 35 micrometers thick) hard-rolled copper having approximately the same lineal dimensions were immersed in the bath, in an approximately parallel arrangement and spaced apart about 3 inches (8 centimeters). The surface of the copper away from the electrode was masked by an insulating film. A voltage supply was connected across the electrode and copper sample, to provide 50 amps per square foot (0.05 amp per square centimeter) of the surface being plated, whereupon the sample was plated for 45 seconds. Upon removal from the bath, the sample had a gray appearance.

A 15-percent-solids solution of polyamic acid was cast on the treated surface of the copper and then dried at 220°F (105°C) for five minutes, 350°F (177°C) for 5 minutes, and 600°F (315°C) for 5 minutes, leaving a dry polyimide layer 12 micrometers thick.

The resulting multilayered sheeting was subjected to two tests. First, the adhesion between the copper foil and polyimide layer was tested by subjecting a 1500-micrometerwide strip of the sheeting to a 90°-peel test in an Instron Tensile Tester, using a rate of separation of the clamps of 2 inches (5 centimeters) per minute. In this test the sample exhibited a peel strength of 3.9 pounds per inch (0.7 kilogram per centimeter) of width.

In the second test, a sample of the multilayered sheeting in which 1500-micrometer wide leads had been etched by either an ammonium persulfate or ferric chloride etching bath was immersed in a hydrochloric acid bath (10-normal hydrochloric acid in water and heated to 25°C) for 30 minutes. After removal from the bath the sample was viewed under a microscope and no undercutting of the leads was observed.

FIG. 1 is an enlarged schematic representation in cross-section of a multilayered sheeting of the invention 10 as prepared according to Example 1, including a layer of electrically conductive metal 11, a black-chromium layer 12, and a layer of electrically insulating polymeric material 13.

EXAMPLE 2

Example 1 was repeated except that instead of casting a polyimide layer onto the treated copper foil, a 3-mil-thick polyimide film ("Kapton" Brand film available from duPont) was adhered to the treated copper foil using an epoxy-based adhesive (consisting principally of an epoxy-terminated adduct of a carboxy-terminated polyester as described in U.S. Pat. No. 3,576,903). The adhesive layer was cured for 15 minutes at 350°F (177°C).

When tested in the manner described in Example 1, the sample had a peel strength of 4.1 pounds per inch (0.73 kilogram per centimeter) width, and there was no undercutting of 1500-micrometer-wide conductors after 2 hours immersion in the hydrochloric acid bath of Example 1.

COMPARATIVE EXAMPLE A

Example 1 was repeated except that the plating bath was designed to apply only a chromium treatment and not a black-chromium treatment. The bath consisted of water, and for each liter of water, 39.3 grams of chromic acid and 3.9 grams of sulfuric acid. Four different plating times were used with 50 amps per square foot (0.05 amp per square centimeter) — 6 seconds, 15 seconds, 30 seconds, and 60 seconds. A silvery, metallic deposit was obtained. The results of peel-strength and acid-etching (10-normal hydrochloric acid in water heated to 25°C) tests for the samples prepared are shown in the following table.

| Sample No. | Peel Strength (kilograms per centimeter width) | Resistance to Acid Bath (micrometers of undercut per edge) | |
| --- | --- | --- | --- |
| | | 5-minute exposure | 30-minute exposure |
| 1 | 0.34 | delaminated | |
| 2 | 0.34 | 100 | 370 |
| 3 | 0.5 | 150 | 560 |
| 4 | 0.45 | 150 | 530 |

Figure 2:
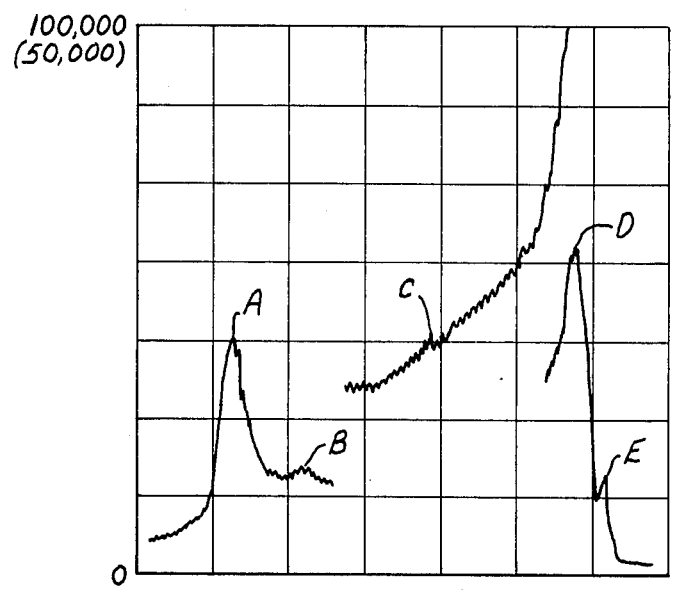
FIGS. 2 and 3 are plots of ion-scattering spectra obtained from a chromium-treated copper foil and a black-chromium-treated copper foil respectively.
Figure 3:
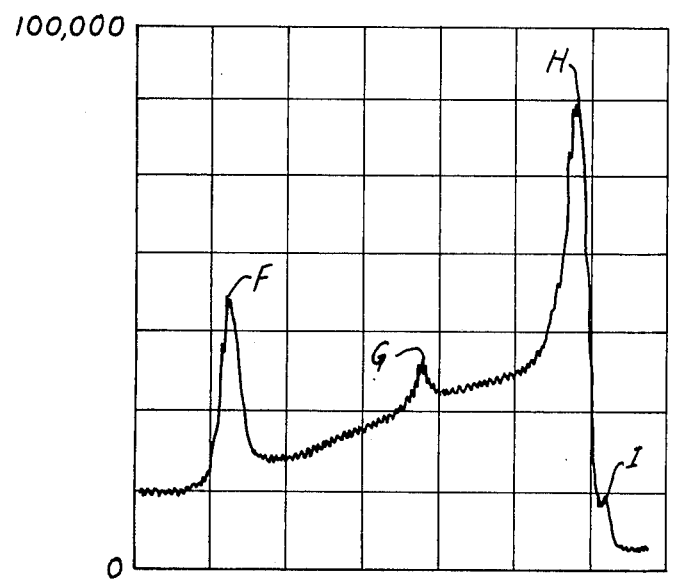

FIGS. 2 and 3 illustrate the difference in ion-scattering spectra that are obtained from a chromium layer (60-second plating time using a solution containing 354 grams of $CrO_3$ and 3.5 grams of $SO_4$ per liter of water) and from a black-chromium layer (60-second plating time using the solution of Example 1). These ion-scattering spectra were developed using an Ion Scattering Spectrometer, Model 520, made by 3M Company and a probe gas that comprised 80 weight-percent helium and 20 weight-percent neon. The ordinate on the spectra graph is intensity (number of ions scattered or counted per second) while the abscissa is voltage. In FIG. 2, the curve is interrupted where the device was switched from a first scale to another scale and then back to the first scale. In FIG. 3 only the first scale was used. Using the first scale, the vertical axis of the graph reads from 0 to 100,000 counts per second, and using the second scale, the vertical axis reads from 0 to 50,000 counts per second. Peaks A, B, C, D, and E on FIG. 2 are for chromium, copper, oxygen, chromium, and copper, respectively. Peaks F, G, H, and I on FIG. 3 are for chromium, oxygen, chromium, and copper, respectively. Peaks A and B on FIG. 2 and peak F of FIG. 3 were developed by the neon component of the probe gas, while peaks C, D, and E of FIG. 2 and G, H, and I of FIG. 3 were developed by the helium component.

As seen in FIG. 2, which is for the chromium layer, substantial peaks occur for chromium (see point A) while there is hardly any peak for oxygen (point C). By constrast, in FIG. 3, which is for Example 1, there are both significant chromium peaks (see point F) and a significant oxygen peak (point G).

COMPARATIVE EXAMPLE B

Example 1 was repeated except that the copper foil was not treated in any way prior to application of the solution of polyamic acid. In the peel strength test, values of 0.9 - 1.3 pounds per inch (0.01 to 0.23 kilogram per centimeter) width were obtained, and leads delaminated from the polyimide layer in less than 5 minutes in the acid bath (using a 10-normal hydrochloric acid bath at 25°C).

EXAMPLE 3

Example 1 was repeated except that the black-chromium treatment was applied by brush-plating (treating solution introduced through a fabric-wrapped porous hollow carbon core, and the copper sample passed against the brush). In the peel strength test, a value of 4.5 pounds per inch (0.8 kilogram per centimeter was obtained and there was no delamination in a 10-normal hydrochloric acid bath at 25°C after 5 minutes.

EXAMPLES 4 and 5

Example 1 was repeated except that the plating baths were two commercial black-chromium treating solutions. The first treating solution was a "Duramir BK" solution available from Ashland Chemical Company and the second was a "Chromonyx" solution from Harshaw Chemical Company. The multilayered sheeting prepared after treatment with the first treating solution exhibited a peel strength of 3.8 pounds per inch width (0.68 kilogram per centimeter) and there was no undercutting after 30 minutes in a 10-normal hydrochloric acid bath at 25°C. The multilayered sheeting prepared after treatment with the second treating solution exhibited an average peel strength of 3.1 pounds per inch (0.55 kilogram per centimeter) width, and in the 10-normal hydrochloric acid bath at 25°C some samples of the sheeting showed up to 4 mils (0.1 millimeter) undercut in 30 minutes and others showed only a slight undercutting after 30 minutes.

EXAMPLE 6

The procedure of Example 1 was repeated except that, instead of a polyimide coating, a 50-micrometer-thick polymeric coating of polycarbodimide was cast using a prepolymer as described in U.S. Pat. No. 3,755,242. Such a layer was applied both to samples of one-ounce (1.4 mils or 35 micrometers thick) hard-rolled copper that had not been treated at all and to copper that had been given a black-chromium treatment as described in Example 1. The peel strengths for the two samples were 3.8 pounds per inch width (0.68 kilogram per centimeter) for the untreated sample and 3.4 pounds per inch (0.61 kilogram per centimeter) for the treated sample. In a 10-normal hydrochloric acid bath at 25 C there was delamination of leads from the untreated sample in 30 seconds whereas there was no undercutting after 30 minutes exposure of the treated sample.

EXAMPLE 7

Example 1 was repeated, except that, instead of a polyimide coating, a 50-micrometer-thick coating of polyparabanic acid was cast from a solution of dimethyl acid amide. Both untreated copper foil and foil given a black-chromium treatment in the manner described in Example 1 were coated. The average peel strengths were 2.8 and 1.6 pounds per inch (0.5 and 0.28 kilogram per centimeter) width, respectively, for the untreated and treated samples; but in a 10-normal hydrochloric acid bath there was 18-mil (450 micrometers) undercutting after 30 minutes for the untreated sample and no undercutting after 30 minutes of the treated sample.

EXAMPLES 8–11

A variety of foils as listed in Table I were given a black chromium treatment as described in Example 1 except that the plating was continued for 30 seconds instead of 45 seconds.

Both treated and untreated samples of the foils were then coated with polyimide as described in Example 1, after which they were tested in the manner described in Example 1. The results are given in Table I.

The improvements in physical bond strength and chemical resistance provided by the invention are especially important for multilayered sheeting in which the conductive metal layer comprises copper and the dielectric support layer comprises polyimide. Copper or copper-based alloys are the most widely used metals in flexible electric circuitry. Some of the copper-based alloys that may be used are an alloy that includes a small amount of an ingredient such as aluminum oxide dispersed in the metal to prevent annealing, and brass, which typically includes 70 or more weight-percent copper. However, as illustrated by Table I, other metals that are used in flexible electric circuitry may beneficially receive a black-chromium treatment, including nickel, nickel-chromium alloys, steel, and iron alloys.

Polyimides offer an excellent combination of electrically insulating properties, heat-resistance, chemical inertness, and physical strength that makes them a preferred dielectric support layer for flexible electric circuitry. Since, as noted above, obtaining good bond strength between rolled copper and a polyimide layer is a difficult challenge, the present invention makes an important contribution. However, the invention is generally useful with any organic polymeric material that is incorporated in multilayered sheeting as a dielectric layer or as an adhesive layer between the metal layer and the dielectric support layer.

Prior to application of the black-chromium treatment, the metal surface should be cleaned of rolling oils or the like with commonly used cleaning agents. The black-chromium treatment

TABLE I

| Example No. | Type of Foil | Thickness of foil (micrometers) | Peel Strength (kilogram per centimeter) | Acid Bath After 5 minutes | Acid Bath After 30 minutes |
|---|---|---|---|---|---|
| 8 | Nickel | 25 | 0.4 | No undercutting | No undercutting |
| Comparison | Nickel untreated | 25 | 0.32 | No undercutting | 0.15–0.3 millimeter undercutting |
| 9 | "Nichrome" | 12 | 0.57 | No undercutting | No undercutting |
| Comparison | "Nichrome" untreated | 12 | 0.29 | No undercutting | Severe undercutting |
| 10 | "Kovar" (an alloy of iron, nickel and cobalt) | 25 | 0.6 | No undercutting | No undercutting |
| Comparison | "Kovar" untreated | 25 | 0.38 | Delaminated | |
| 11 | Steel | 100 | 0.62 | No undercutting | No undercutting |
| Comparison | Steel | 100 | 0.62 | Delaminated | |

TABLE I-continued

| Example No. | Type of Foil | Thickness of foil (micrometers) | Peel Strength (kilogram per centimeter) | Acid Bath After 5 minutes | Acid Bath After 30 minutes |
|---|---|---|---|---|---|
| | untreated | | | | | is generally rather thin, and often the underlying copper color is visible through the coating.

The conditions for applying the black-chromium treatment can be varied to obtain optimum results for a particular purpose. For example, the peel strength obtained can be varied by varying the length of time of the treatment and by varying the current used in the plating bath. When Example 1 was repeated except that variations were made in the time of the plating and in the current applied, results were as follows:

| Time (Seconds) | Average Peel Strength (kilogram per centimeter width) |
|---|---|
| 10 | 0.46 |
| 20 | 0.71 |
| 30 | 0.8 |
| 60 | 0.75 |

| Amps per Square Foot (per square centimeter) | Average Peel Strength (kilogram per centimeter width |
|---|---|
| 20 (0.022) | 0.2 |
| 40 (0.043) | 0.55 |
| 60 (0.065) | 0.75 |
| 80 (0.086) | 0.8 |

Following selective removal of portions of either the metal layer (as by etching) or dielectric layer (as by chemical milling) of sheeting of the invention, the black chromium layer uncovered by the removal usually also needs to be removed. The black chromium layer can be removed by solutions of alkaline potassium ferricyanide and usually can also be removed by a 10-normal hydrochloric acid solution.

What is claimed is:

1. Multilayered sheeting useful as a component of flexible electric circuitry, comprising a layer of electrically conductive metal, a thin black-chromium layer on at least one side of the layer of conductive metal, and a layer of electrically insulating polymeric material bonded to said black-chromium layer, whereby after etching of the layer conductive metal to provide narrow-width conductors, the conductors will not be delaminated from the layer of electrically insulating polymeric material by exposure of the sheeting for 5 minutes in a 10-normal hydrochloric acid bath at 25°C.

2. Multilayered sheeting of claim 1 in which the layer of conductive metal comprises copper.

3. Multilayered sheeting of claim 1 in which the layer of electrically insulating polymeric material comprises a polyimide.

4. Multilayered sheeting of claim 1 in which said layer of electrically insulating polymeric material is an adhesive layer disposed between an additional layer of electrically insulating polymeric material and said layer of conductive metal.

5. Multilayered sheeting of claim 4 in which said adhesive layer comprises an epoxy-terminated reactive compound.

6. Multilayered sheeting of claim 1 in which the layer of conductive metal is configured as an electrical circuit.

7. Multilayered sheeting of claim 6 in which electrical components are electrically connected to the layer of conductive metal.

8. Multilayered sheeting useful as a component of electric circuitry comprising a layer of copper-based electrically conductive metal, a thin black-chromium layer on at least one side of the layer of conductive metal, and a layer of polyimide electrically insulating polymeric material bonded to said black-chromium layer, whereby after etching of the layer of conductive metal to provide narrow-width conductors, the conductors will not be delaminated from the polyimide layer by exposure for 5 minutes in a 10-normal hydrochloric acid bath at 25°C.

9. Multilayered sheeting of claim 8 in which the layer of conductive metal is configured as an electrical circuit.

10. Multilayered sheeting of claim 9 in which electrical components are electrically connected to the layer of conductive metal.

11. Multilayered sheeting of claim 9 in which the layer of conductive metal comprises rolled copper.

12. Multilayered sheeting useful as a component of flexible electrical circuitry comprising a rolled copper foil, a thin black-chromium layer deposited on at least one largearea surface of the foil, and a layer of electrically insulating polymeric material bonded to said black-chromium layer, whereby after etching of the layer of conductive metal to provide narrow-width conductors, the conductors will not be delaminated from the layer of electrically insulating polymeric material by exposure of the sheeting for five minutes in 10-normal hydrochloric acid bath at 25°C.

13. Multilayered sheeting of claim 12 in which said polymeric material comprises a polyimide.

* * * * *